(12) United States Patent
Hagen et al.

(10) Patent No.: US 11,842,863 B2
(45) Date of Patent: Dec. 12, 2023

(54) MECHANICAL INTERLOCK WITH ENHANCED FEATURES

(71) Applicant: LEVITON MANUFACTURING CO., INC., Melville, NY (US)

(72) Inventors: William Hagen, Melville, NY (US); Anthony Camarda, Broadlands, VA (US); Darius Bobelis, Hauppauge, NY (US); Eugene Frid, Great Neck, NY (US)

(73) Assignee: LEVITON MANUFACTURING CO., INC., Melville, NY (US)

( * ) Notice: Subject to any disclaimer, the term of this patent is extended or adjusted under 35 U.S.C. 154(b) by 72 days.

(21) Appl. No.: 16/616,588

(22) PCT Filed: Nov. 14, 2019

(86) PCT No.: PCT/US2019/061362
§ 371 (c)(1),
(2) Date: Nov. 25, 2019

(87) PCT Pub. No.: WO2020/106535
PCT Pub. Date: May 28, 2020

(65) Prior Publication Data
US 2021/0166898 A1    Jun. 3, 2021

Related U.S. Application Data

(60) Provisional application No. 62/769,733, filed on Nov. 20, 2018.

(51) Int. Cl.
*H01H 21/06* (2006.01)
*H01R 13/713* (2006.01)
(Continued)

(52) U.S. Cl.
CPC ......... *H01H 21/06* (2013.01); *G01R 31/3277* (2013.01); *H01H 21/22* (2013.01);
(Continued)

(58) Field of Classification Search
None
See application file for complete search history.

(56) References Cited

U.S. PATENT DOCUMENTS 1,818,290 A    8/1931    Wulle
2,241,828 A *  5/1941    Reynolds ............. H01R 13/707
                                              200/51 R
(Continued)

FOREIGN PATENT DOCUMENTS

GB    309714 A      4/1929
GB    2292488 B    11/1996
(Continued)

OTHER PUBLICATIONS

International Search Report and Written Opinion for the International Patent Application No. PCT/US22/11524, dated Apr. 7, 2022, 14 pages.

(Continued)

*Primary Examiner* — Felix O Figueroa
(74) *Attorney, Agent, or Firm* — KDW FIRM PLLC

(57) ABSTRACT

An improved mechanical interlock including one or more features to facilitate a more robust design, easier assembly, and/or enhanced capabilities. For example, the mechanical interlock may include an interlock latch operatively associated with an external handle assembly and an internal connector. The interlock latch being directly coupled to a shaft coupled to the handle assembly, thus providing an improved and more robust latching mechanism. The mechanical interlock may also include one or more keys (e.g., a Poke-Yoke feature) to facilitate easier assembly (Continued)

and/or to prevent human errors caused by improper assembly. The mechanical interlock may also include an integrated magnetic switch and monitoring system to ensure that accurate location of the handle assembly is known.

17 Claims, 15 Drawing Sheets

(51) Int. Cl.
*G01R 31/327* (2006.01)
*H01H 21/22* (2006.01)
*H01R 13/639* (2006.01)
*H01R 13/70* (2006.01)

(52) U.S. Cl.
CPC ......... *H01R 13/639* (2013.01); *H01R 13/701* (2013.01); *H01H 2207/022* (2013.01); *H01H 2221/052* (2013.01); *H01H 2239/058* (2013.01)

(56) References Cited

U.S. PATENT DOCUMENTS

| | | | |
|---|---|---|---|
| 3,088,004 A | 4/1963 | Mueller | |
| 3,277,251 A | 10/1966 | Daly | |
| 3,277,253 A * | 10/1966 | Bacon | H01R 13/707 200/50.28 |
| 3,887,256 A | 6/1975 | Klimek et al. | |
| 4,345,122 A * | 8/1982 | Janniello | H01R 13/707 439/352 |
| 5,298,701 A * | 3/1994 | Sandor | H01R 13/707 200/50.31 |
| 5,448,027 A * | 9/1995 | Hoffman | H01R 13/707 200/50.31 |
| 5,625,289 A | 4/1997 | Daetz et al. | |
| 5,680,926 A | 10/1997 | Sandor et al. | |
| 6,106,320 A * | 8/2000 | Gunn | H01R 13/6278 439/349 |
| 6,201,709 B1 | 3/2001 | Justiniano et al. | |
| 6,255,607 B1 * | 7/2001 | Miller | H01R 13/707 200/50.29 |
| 6,956,176 B2 | 10/2005 | Castaldo | |
| 7,119,292 B2 | 10/2006 | Castaldo | |
| 7,268,538 B2 | 9/2007 | Johnson | |
| 9,472,908 B2 * | 10/2016 | Shendge | H01R 13/4532 |
| 2017/0098520 A1 | 4/2017 | Mittelstadt | |
| 2020/0052482 A1 | 2/2020 | Ostrovsky et al. | |
| 2020/0123086 A1 | 4/2020 | Wietelmann et al. | |

FOREIGN PATENT DOCUMENTS

| | | |
|---|---|---|
| WO | 2018053644 A1 | 3/2018 |
| WO | 2020123086 A1 | 6/2020 |

OTHER PUBLICATIONS

Author Unknown., "How Rotary Encoders Work" Celera Motion—Feb. 9, 2021, 7 pages.
Author Unknown., "Roarty Position Sensors" Celera Motion—Mar. 15, 2021, 7 pages.
International Search Report and Written Opinion for the International Patent Application No. PCT/US19/61362, dated Mar. 19, 2020, 11 pages.

* cited by examiner

MECHANICAL INTERLOCK WITH ENHANCED FEATURES

CROSS-REFERENCE TO RELATED APPLICATIONS

This application is a United States National Phase filing of International Application No. PCT/US2019/061362, filed Nov. 14, 2019, which is a non-provisional of, and claims the benefit of the filing date of, U.S. provisional patent application No. 62/769,733, filed Nov. 20, 2018, entitled "Mechanical Interlock with Enhanced Features," which applications are incorporated in their entirety by reference herein.

FIELD OF THE DISCLOSURE

The present disclosure relates generally to electrical devices such as mechanical interlocks, disconnect switches, rotatably actuatable switches, etc., and more particularly to mechanical interlocks incorporating one or more enhanced features to provide a more robust locking mechanism, to facilitate easier assembly, and/or to provide additional capabilities.

BACKGROUND OF THE DISCLOSURE

Electrical switches such as, for example, disconnect switches, mechanical interlocks, rotatably actuatable switches, etc. (collectively referred to herein as a mechanical interlock or mechanical interlocks without the intent to limit) are used in a variety of commercial applications, both indoors and outdoors, for energizing and de-energizing electrical devices, such as machinery, motors, lights, fans, pumps, generators and the like.

Generally speaking, mechanical interlocks are arranged and configured to receive, for example, one or more pin and sleeve devices such as, for example, a plug to supply electrical power to downstream electrical devices. Mechanical interlocks are generally designed for use in harsh or high abuse environments such as, for example, wet, dusty, or corrosive environments.

As will be appreciated by one of ordinary skill in the art, mechanical interlocks include, inter alia, an electrical enclosure, an external handle assembly connected to an electrical load switch located within the electrical enclosure, and a connector (e.g., a female receptacle) for coupling to the plug. The mechanical interlock may also include a number of other electrical and mechanical components as well such as, for example, fuses, contactors, etc.

As will be appreciated by one of ordinary skill in the art, the mechanical interlock receives power through a plurality of power input lines and supplies power to, for example, a plug coupled to the connector. The external handle assembly mounted to the front of the enclosure may be connected to the load switch through, for example, a shaft to operate the actuating mechanism of the load switch. In use, the external handle assembly is rotationally locked to the load switch via the shaft. Thus arranged, rotational movement of the handle assembly causes the shaft to rotate, which in turn rotates the load switch to selectively supply and disconnect power from the connector, and hence the plug and the downstream electrical device.

That is, in use, the downstream electrical device can be energized or de-energized, depending on the direction of rotation of the handle assembly. That is, the mechanical interlock is "ON" (e.g., supplying power to the connected, downstream electrical device) when the plug is coupled to the connector and the handle assembly is in an "ON" position. When the handle assembly is moved to an "OFF" position, the actuating mechanism of the load switch will have been moved to open the contacts, so that power to the associated electrical device is disconnected. Generally speaking, the handle assembly is rotated ninety-degrees to transition the mechanical interlock between the ON and OFF positions.

In use, mechanical interlocks include a locking mechanism that prevents making and breaking of power under load. That is, in use, the mechanical interlock is arranged and configured so that the handle assembly cannot be moved to the "ON" position until a plug is coupled to the connector. Similarly, in use, the mechanical interlock is arranged and configured so that the plug cannot be removed or decoupled from the connector of the mechanical interlock until the handle assembly has been rotated or actuated to the OFF position. That is, for example, until the handle assembly has been rotated to the OFF position, the plug cannot be removed. In this manner, mechanical interlocks prevent making or breaking of power under load. This is a simplified explanation of the operation of the mechanical interlock for purposes of the present disclosure.

It would be desirable to provide mechanical interlocks with one or more enhanced features to provide a more robust locking mechanism, to facilitate easier assembly, and/or to provide additional capabilities.

SUMMARY OF THE DISCLOSURE

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one embodiment, disclosed herein is a mechanical interlock including an enclosure, a connector at least partially received within the enclosure for selectively receiving a plug, a load switch positioned within the enclosure, the load switch arranged and configured to selectively supply power to the connector, a handle assembly operatively associated with the enclosure, the handle assembly being selectively movable between an ON position and an OFF position to selectively energize and deenergize the load switch, a shaft for rotationally coupling the handle assembly to the load switch, and an interlock latch arranged and configured to be operatively associated with the connector and the handle assembly, the interlock latch movable between a first position and a second position, wherein, when in the first position, the interlock latch prevents rotation of the handle assembly, and when in the second position, the interlock latch enables rotation of the handle assembly so that the handle assembly can be moved from the OFF position to the ON position.

In one embodiment, the interlock latch includes a first end and a second end, the first end being arranged and configured to contact the plug upon insertion of the plug into the connector so that the interlock latch is moved from the first position to the second position via insertion of the plug into the connector.

In one embodiment, the second end of the interlock latch is selectively coupled to the shaft so that, when the interlock latch is in the first position, the second end of the interlock latch engages the shaft so that rotation of the shaft and the handle assembly is prevented, and, when the interlock latch is in the second position, the second end of the interlock latch is decoupled from the shaft so that rotation of the shaft and the handle assembly is permitted.

Additionally, and/or alternatively, in one embodiment, the mechanical interlock may include a plug connector arranged and configured to prevent the plug from being removed from the connector when the handle assembly is in the ON position. In one embodiment, the plug connector includes a slider plate and a latch spring, the slider plate movable from a first position to a second position via rotation of the handle assembly from the OFF position to the ON position, wherein, when the slider plate is in the second position, the latch spring engages the plug inserted into the connector so that removal of the plug is prevented.

Additionally, and/or alternatively, in one embodiment, the mechanical interlock may include a magnetic switch including a magnet and a sensor arranged and configured to determine a position of the handle assembly. In one embodiment, when the handle assembly is in the OFF position, the magnet is arranged and configured to interact with the sensor to provide an indication that the handle assembly is in the OFF position, and when the handle assembly is in the ON position, the magnet is positioned at a distance from the sensor such that the sensor does not sense the magnet.

Additionally, and/or alternatively, in one embodiment, the mechanical interlock may include a battery power supply for supplying backup power to the magnetic switch and/or a processor in case of mains power lost.

BRIEF DESCRIPTION OF THE DRAWINGS

By way of example, a specific embodiment of the disclosed device will now be described, with reference to the accompanying drawings, in which.

Figure 1:
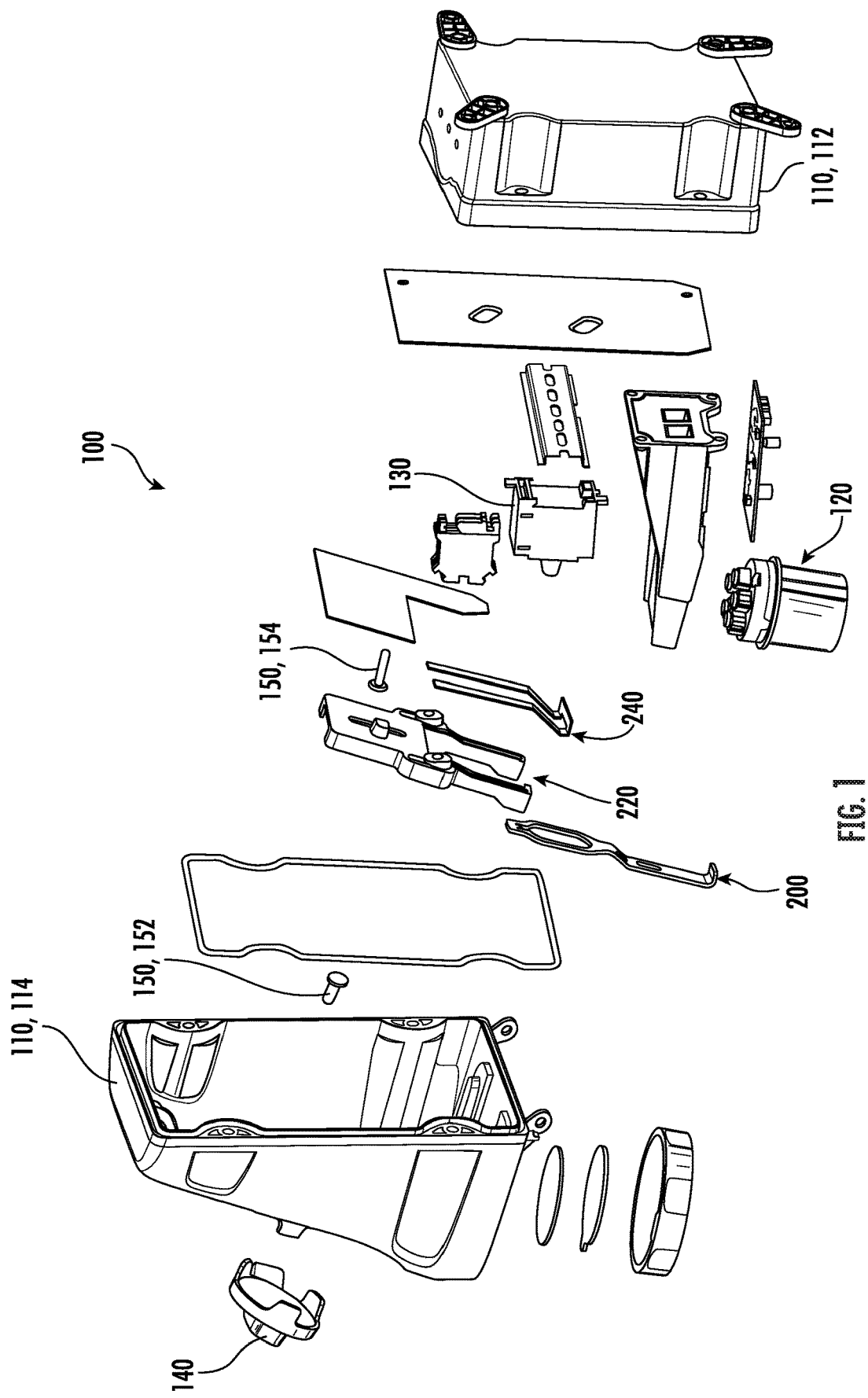
FIG. 1 is an exploded, perspective view of a mechanical interlock in accordance with one or more aspects of the present disclosure.

The drawings are not necessarily to scale. The drawings are merely representations, not intended to portray specific parameters of the disclosure. The drawings are intended to depict example embodiments of the disclosure, and therefore are not be considered as limiting in scope. In the drawings, like numbering represents like elements.

DETAILED DESCRIPTION

Numerous embodiments of improved mechanical interlocks in accordance with the present disclosure will now be described more fully hereinafter with reference to the accompanying drawings, in which preferred embodiments of the present disclosure are presented. The mechanical interlock of the present disclosure may, however, be embodied in many different forms and should not be construed as being limited to the embodiments set forth herein. Rather, these embodiments are provided so that this disclosure will convey certain example aspects of the mechanical interlock to those skilled in the art. In the drawings, like numbers refer to like elements throughout unless otherwise noted.

As will be described in greater detail below, in various embodiments, a mechanical interlock according to the present disclosure may include one or more features to facilitate a more robust design, easier assembly, and/or enhanced capabilities as compared to prior devices. That is, for example, according to the present disclosure, a mechanical interlock may include an improved locking mechanism for ensuring that the external handle assembly can only be rotated to the ON position after proper insertion of a plug. For example, the mechanical interlock may include an interlock latch operatively associated with the external handle assembly and the internal connector. In one embodiment, the interlock latch is in direct contact with a plug inserted into the connector and a shaft coupled to the external handle assembly. By providing a direct coupling, a more robust locking/latching mechanism is provided that cannot be easily circumvented. In addition, a mechanical interlock may include one or more keys (e.g., a Poke-Yoke feature) to facilitate easier assembly and/or to prevent human errors caused by improper assembly. For example, in one embodiment, the mechanical interlock may include one or more keys between a latch spring and the enclosure to prevent improper insertion and/or orientation of the latch spring. Additionally, and/or alternatively, the mechanical interlock may include an integrated magnetic switch and monitoring system to ensure that the location of the external handle assembly is known so that the position of the handle assembly can be compared to the state of the device, and if necessary, one or more fault indications can be provided.

As will be described herein, the features according to the present disclosure may be used with any suitable mechanical interlock now known or hereafter developed. As such, details regarding construction and operation of the mechanical interlock are omitted for sake of brevity of the present disclosure. In this regard, the present disclosure should not be limited to the details of the mechanical interlock disclosed and illustrated herein unless specifically claimed and that any suitable mechanical interlock can be used in connection with the principles of the present disclosure.

As previously mentioned, mechanical interlocks can be used to supply power to connected devices via, for example, a pin and sleeve device such as, for example, a plug (not shown). That is, for example, a plug can be connected to the mechanical interlock for supplying power to a downstream electrical device.

Referring to FIG. 1, the mechanical interlock 100 includes a number of components including, inter alia, an enclosure 110, a connector 120 for coupling to, for example, a plug 50 (FIGS. 3 and 10), an internal load switch 130, an external handle assembly 140, and a shaft 150 for rotationally coupling the external handle assembly 140 to the internal load switch 130. In the illustrated embodiment, the shaft 150 may be in the form of a two-piece shaft so that the external handle assembly 140 may be operatively coupled to a handle portion or shaft 152 and the load switch 130 may be coupled to a switch portion or shaft 154, the handle portion or shaft 152 may be rotationally coupled to the switch portion or shaft 154 so that rotation of the external handle assembly 140 rotates the handle portion or shaft 152, which rotates the switch portion or shaft 154, which rotates/actuates the load switch 130 (portion and shaft used interchangeably herein without the intent to limit).

As illustrated, the enclosure 110 may be made up of a rear housing portion or base 112 and a front housing portion or cover 114, although it is envisioned that the enclosure 110 may be manufactured from more or less portions. In addition, the enclosure 110 may be manufactured from any suitable material including, for example, plastic, metal, or the like.

Figure 2:
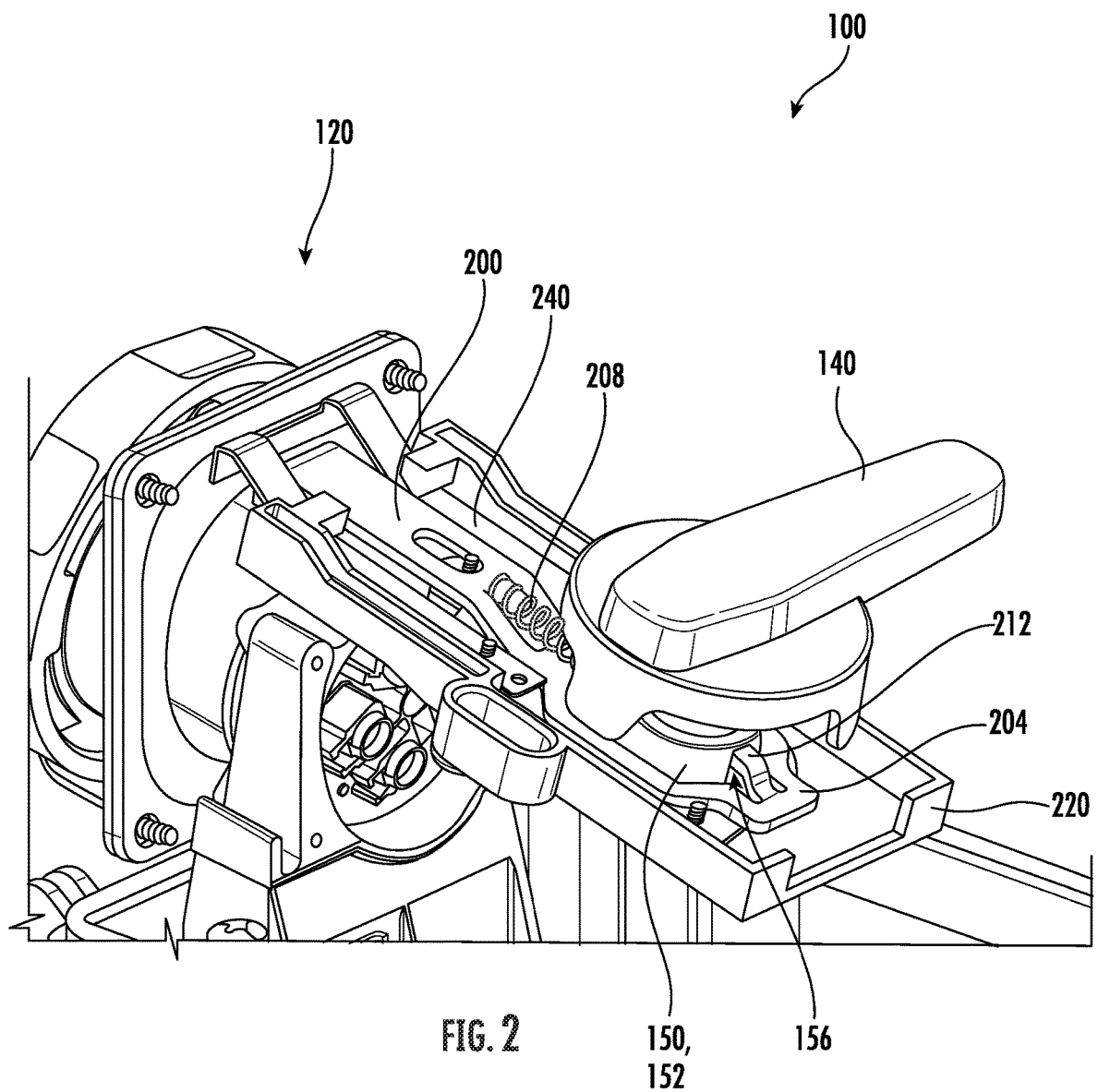
FIG. 2 is a detailed, partial, front, perspective view of the mechanical interlock shown in FIG. 1, the mechanical interlock including an interlock latch illustrated in a first position, the cover portion being omitted for clarity.
Figure 3:
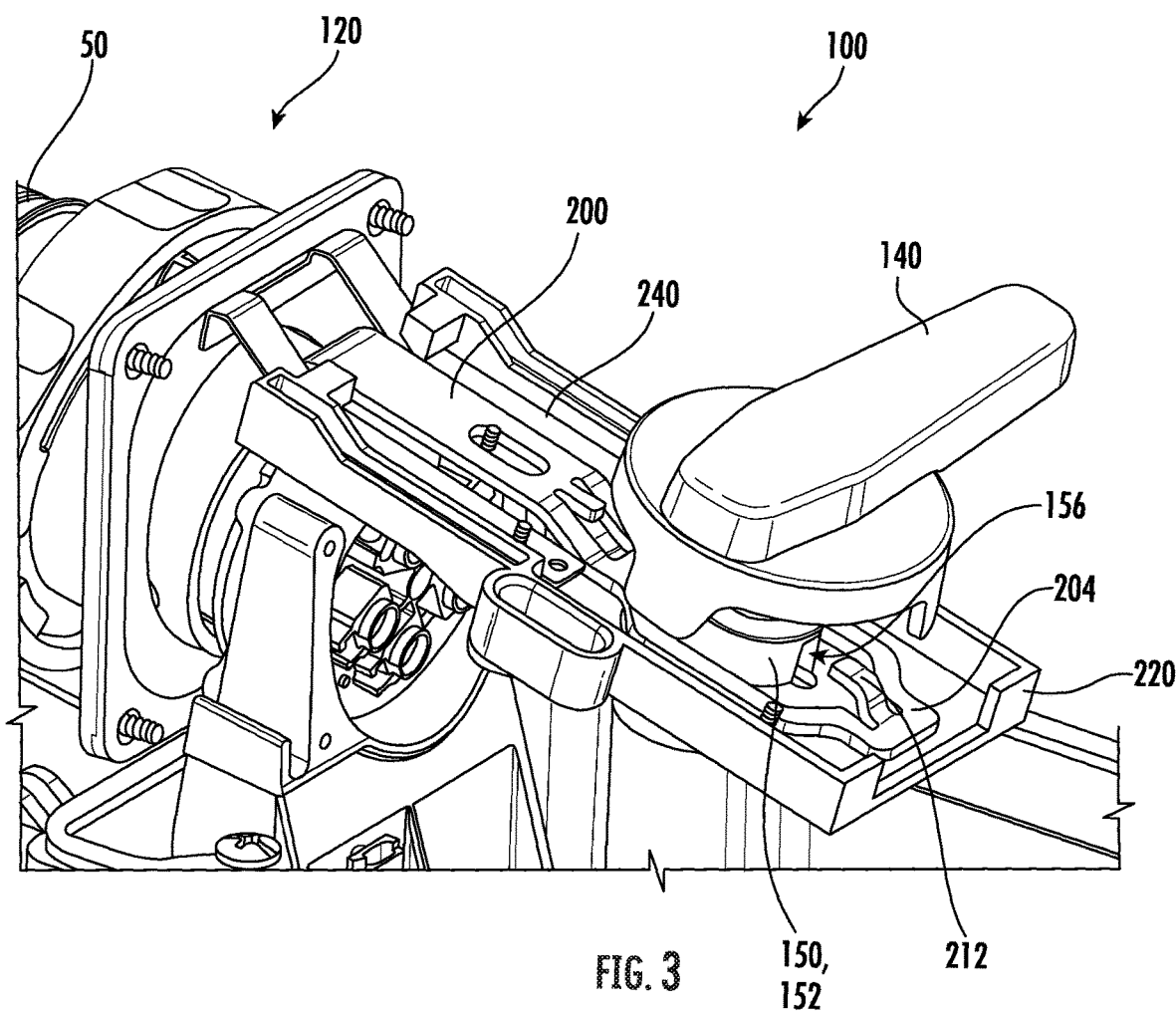
FIG. 3 is a detailed, partial, front, perspective view of the mechanical interlock shown in FIG. 1, the mechanical interlock including an interlock latch illustrated in a second position, the cover portion being omitted for clarity.
Figure 4:
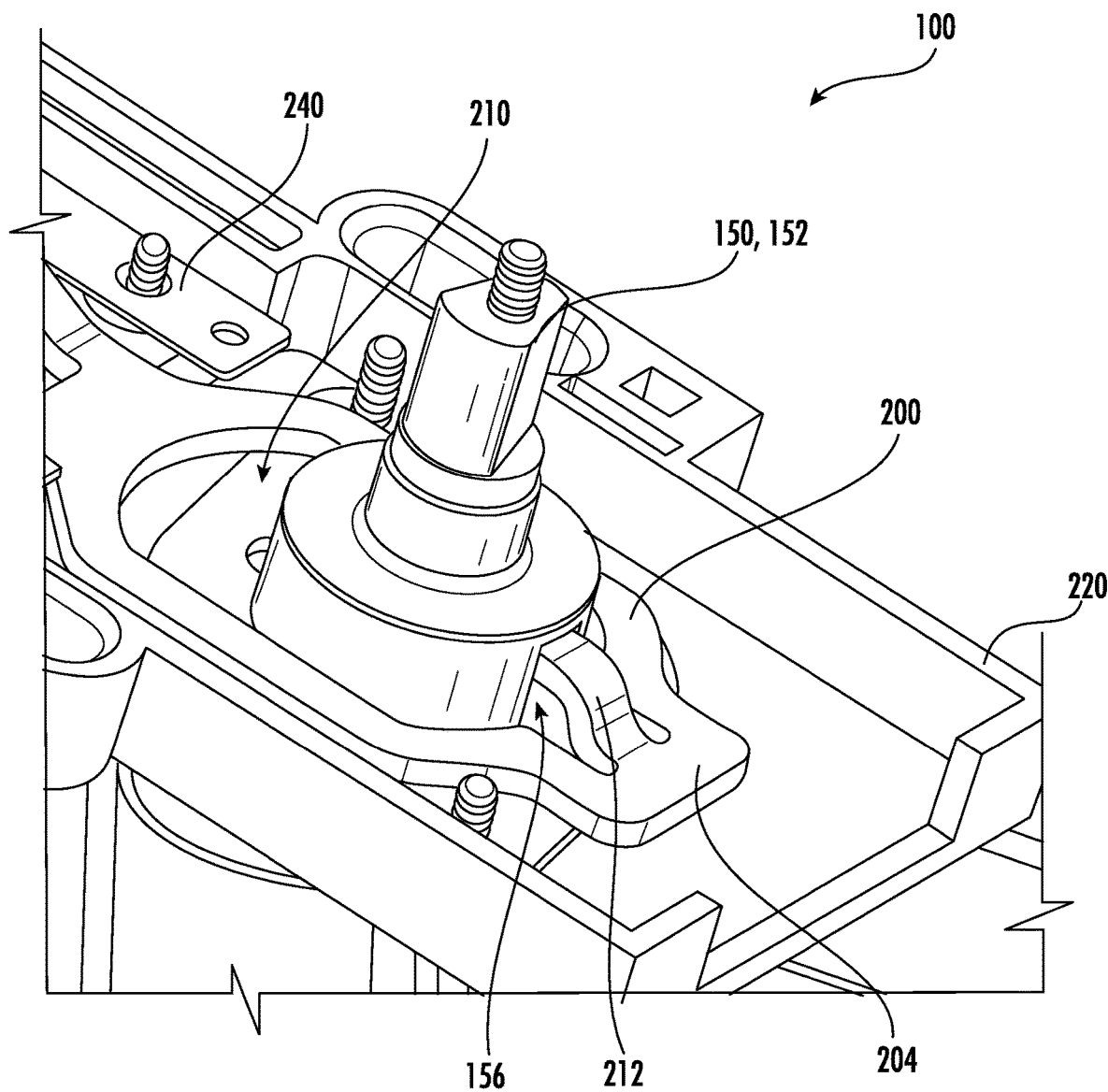
FIG. 4 is a detailed, partial, rear perspective view of the mechanical interlock shown in FIG. 1, the mechanical interlock including an interlock latch illustrated in a first position.
Figure 5:
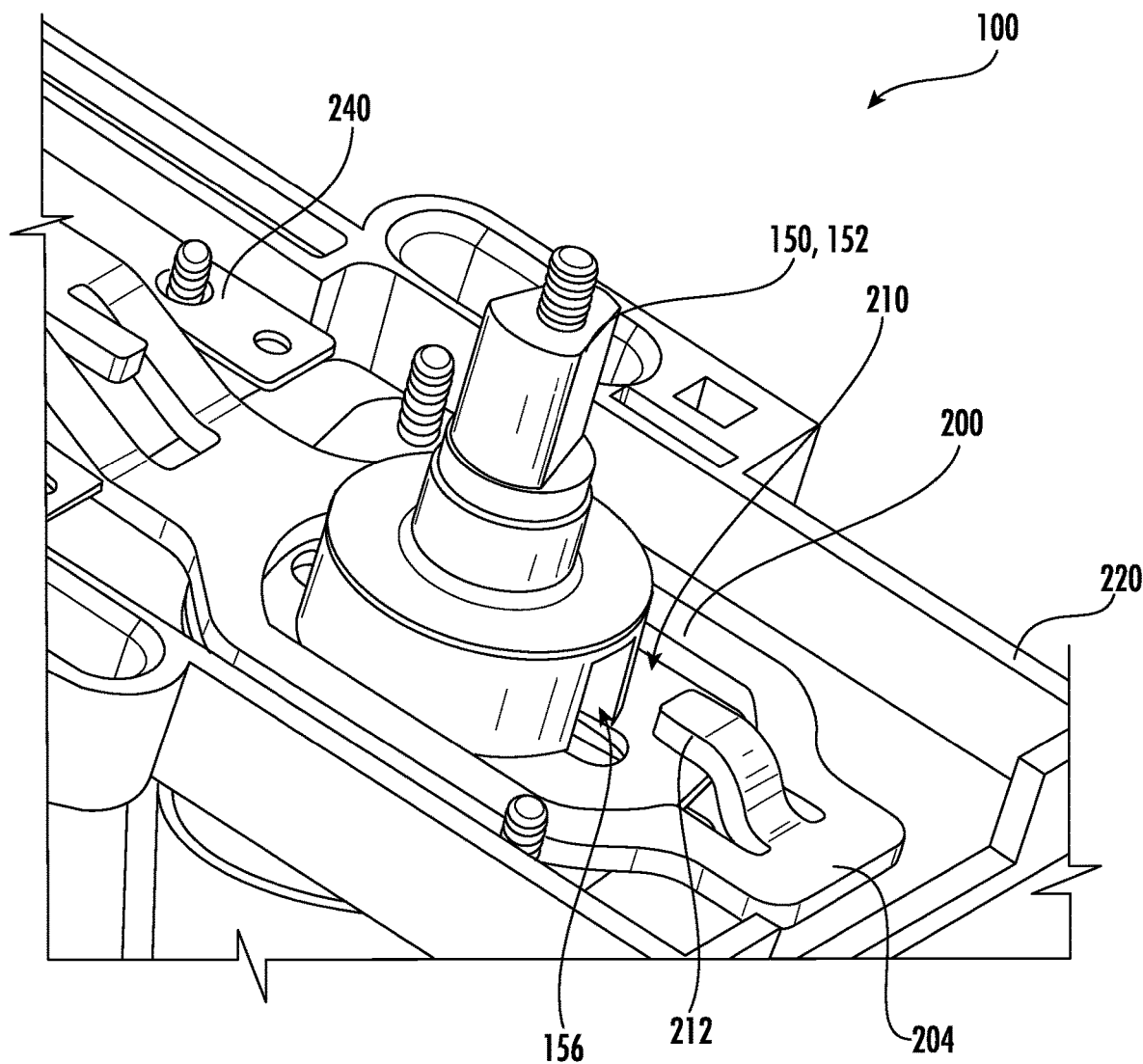
FIG. 5 is a detailed, partial, rear, perspective view of the mechanical interlock shown in FIG. 1, the mechanical interlock including an interlock latch illustrated in a second position.

In one example embodiment, the mechanical interlock 100 may also include an interlock latch 200, a slider plate 220, and a latch spring 240. As will be described in greater detail, in use, the interlock latch 200 is selectively movable between a first position (FIGS. 2 and 4) and a second position (FIGS. 3 and 5). The interlock latch 200 is arranged and configured to be operatively associated with the connector 120 and the external handle assembly 140 so that when the interlock latch 200 is in the first position, the interlock latch 200 prevents rotation of the external handle assembly 140, and when the interlock latch 200 is in the second position, the interlock latch 200 permits rotation of the external handle assembly 140. In one embodiment, the interlock latch 200 is movable between the first position and the second position via insertion of the plug 50 (FIG. 3) into the connector 120. That is, insertion of the plug 50 into the connector 120 contacts and moves the interlock latch 200 from the first position (FIGS. 2 and 4) to the second position (FIGS. 3 and 5).

Figure 6A:
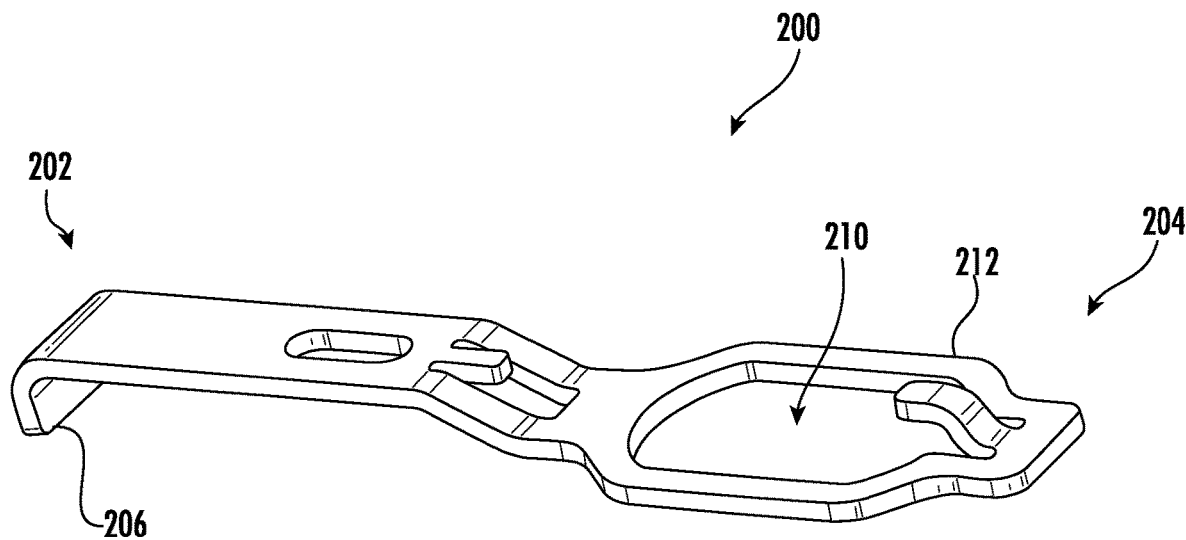
FIG. 6A is a front perspective view of an example embodiment of an interlock latch for use with the mechanical interlock shown in FIG. 1.
Figure 6B:
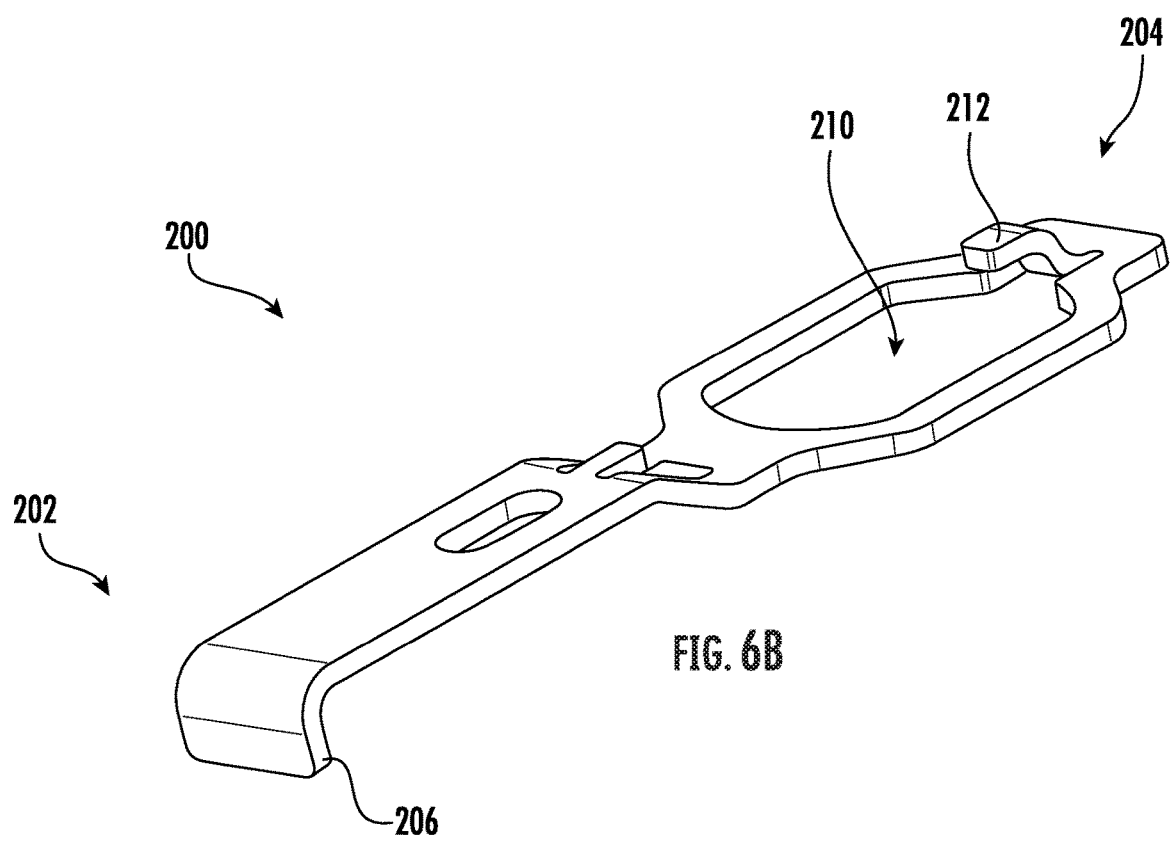
FIG. 6B is a rear perspective view of an example embodiment of an interlock latch for use with the mechanical interlock shown in FIG. 1.

Referring to FIGS. 6A and 6B, the interlock latch 200 includes a first end 202 and a second end 204. In use, the first end 202 of the interlock latch 200 is arranged and configured to be contacted by the plug 50 (FIG. 3) upon insertion of the plug 50 into the connector 120. For example, the first end 202 may include a shelf 206 for contacting the plug 50. In use, insertion of the plug 50 into the connector 120 of the mechanical interlock 100 causes the plug 50 to contact and move the interlock latch 200 from the first position (FIGS. 2 and 4) to the second position (FIGS. 3 and 5). In one embodiment, the interlock latch 200 moves axially (e.g., interlock latch 200 moves along a longitudinal axis of the latch) from the first position (FIGS. 2 and 4) to the second position (FIGS. 3 and 5). In use, the interlock latch 200 may be biased towards the first position so that when the plug 50 is not engaged with the connector 120, the external handle assembly 140 is prevented from being rotated to the ON position. The interlock latch 200 may be biased by any suitable mechanism now known or hereafter developed including, for example, a spring 208 (FIG. 2).

As illustrated in FIGS. 2-5, the second end 204 of the interlock latch 200 is arranged and configured to selectively engage the shaft 150 such as, for example, the handle shaft 152. In this manner, when the interlock latch 200 is in the first position (FIGS. 2 and 4), the second end 204 of the interlock latch 200 engages the shaft 150 (e.g., handle shaft 152) so that rotation of the shaft 150, and hence the external handle assembly 140 coupled thereto, is prevented so that rotation of the handle assembly 140 from the OFF position to the ON position is prevented until a plug 50 has been fully inserted into the connector 120. Meanwhile, when the interlock latch 200 is in the second position (e.g., when a plug 50 has been fully inserted into the connector 120) (FIGS. 3 and 5), the second end 204 of the interlock latch 200 is arranged and configured to decouple from the shaft 150 (e.g., the second end 204 of the interlock latch 200 disengages from the handle shaft 152) so that rotation of the shaft 150, and hence the external handle assembly 140 coupled thereto, is permitted so that rotation of the handle assembly 140 can be rotated from the OFF position to the ON position.

As illustrated, the second end 204 of the interlock latch 200 may include a bore or opening 210 so that the shaft 150 (e.g., handle shaft 152) may pass through the interlock latch 200. In addition, the second end 204 of the interlock latch 200 may include a key 212 such as, for example, a projection, a hook, or the like, for engaging a recess or slot 156 formed in the shaft 150.

Figure 7A:
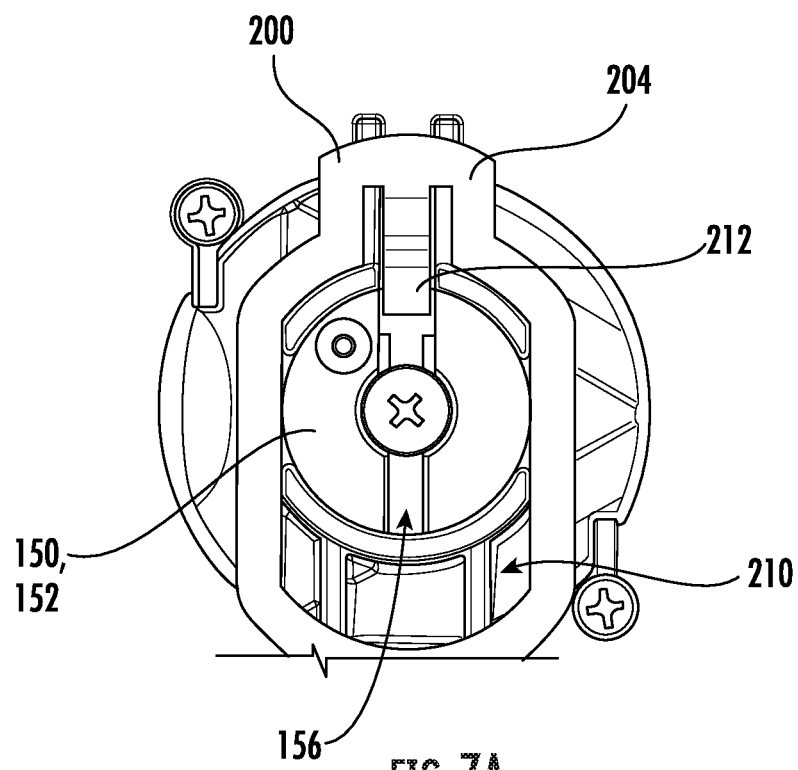
FIG. 7A is a detailed, rear, elevational view of an example embodiment of an interlock latch, the interlock latch illustrated in a first position with the interlock latch coupled to a shaft associated with the handle assembly.
Figure 7B:
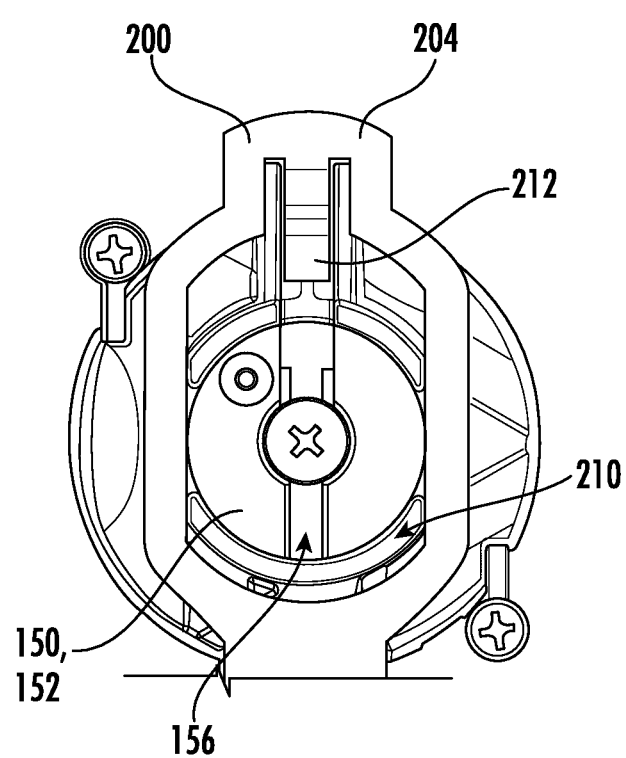
FIG. 7B is a detailed, rear, elevational view of the interlock latch shown in FIG. 7A, the interlock latch illustrated in a second position with the interlock latch decoupled from the shaft.
Figure 8A:
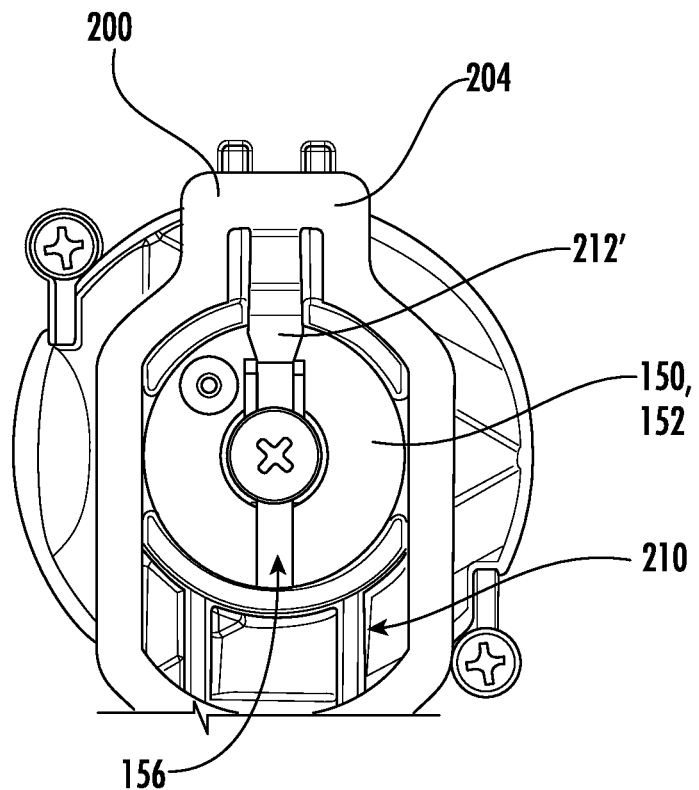
FIG. 8A is a detailed, rear, elevational view of an alternate example embodiment of an interlock latch, the interlock latch illustrated in a first position with the interlock latch coupled to a shaft associated with the handle assembly.
Figure 8B:
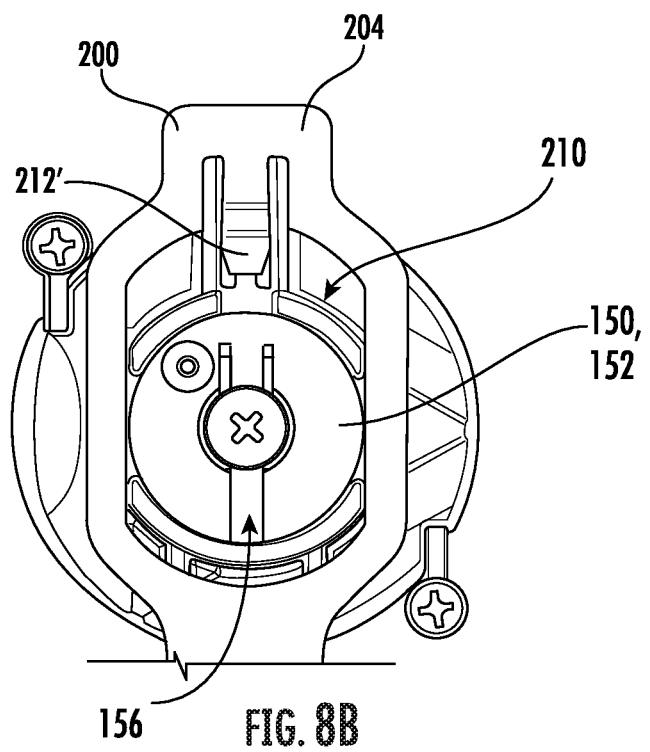
FIG. 8B is a detailed, rear, elevational view of the interlock latch shown in FIG. 8A, the interlock latch illustrated in a second position with the interlock latch decoupled from the shaft.

Referring to FIGS. 7A and 7B, in one non-limiting example embodiment, the key 212 may be in the form of a blunt projection. That is, for example, the key 212 may include perpendicular sides and/or sharp corners for interacting with the slot 156 formed in the shaft 150 (e.g., handle shaft 152). Alternatively, referring to FIGS. 8A and 8B, the key 212' may include sloped sides and/or rounded corners for interacting with the slot 156 formed in the shaft 150 (e.g., handle shaft 152). By providing the key 156 with rounded corners, it has been discovered that machining of the slot 156 in the shaft 150 (e.g., handle shaft 152) is simplified as the tolerances are not as critical to ensuring desired engagement between the interlock latch 200 and the shaft 150. In addition, by providing the key 212 with rounded corners, the key 212 can center itself as it engages the slot 156 formed in the shaft 150. However, it is envisioned that the key 212 and the slot 156 may have any other suitable shapes, configurations, etc., to facilitate inter-engagement between the interlock latch 200 and the shaft 150.

In accordance with one aspect of the present disclosure, by directly coupling the interlock latch 200 to the shaft 150 (e.g., handle shaft 152), which directly connects to the external handle assembly 140, and by arranging and configuring the interlock latch 200 so that inserting a plug 50 into the connector 120 causes the plug 50 to directly contact the interlock latch 200, an improved robust rotational locking mechanism is provided that allows rotation of the external handle assembly 140 only when the plug 50 is properly inserted into the connector 120, and that locks the handle assembly 140 in the OFF position when the plug 50 is not inserted into the connector 120. Directing coupling the interlock latch 200 to the rotational drive mechanism of the mechanical interlock 100 (e.g., external handle assembly 140 and the shaft 150) provides numerous advantages over current devices including, for example, maintaining the locking or latching feature at the rotating elements where rotational torque is applied. This is in contrast to known devices where the locking or latching feature is located at more remote locations from the rotating elements, which allows for excessive slop that can lead to the locking feature being overridden due to the application of excessive forces and/or distortion or deflection of the interconnecting parts.

Figure 9:
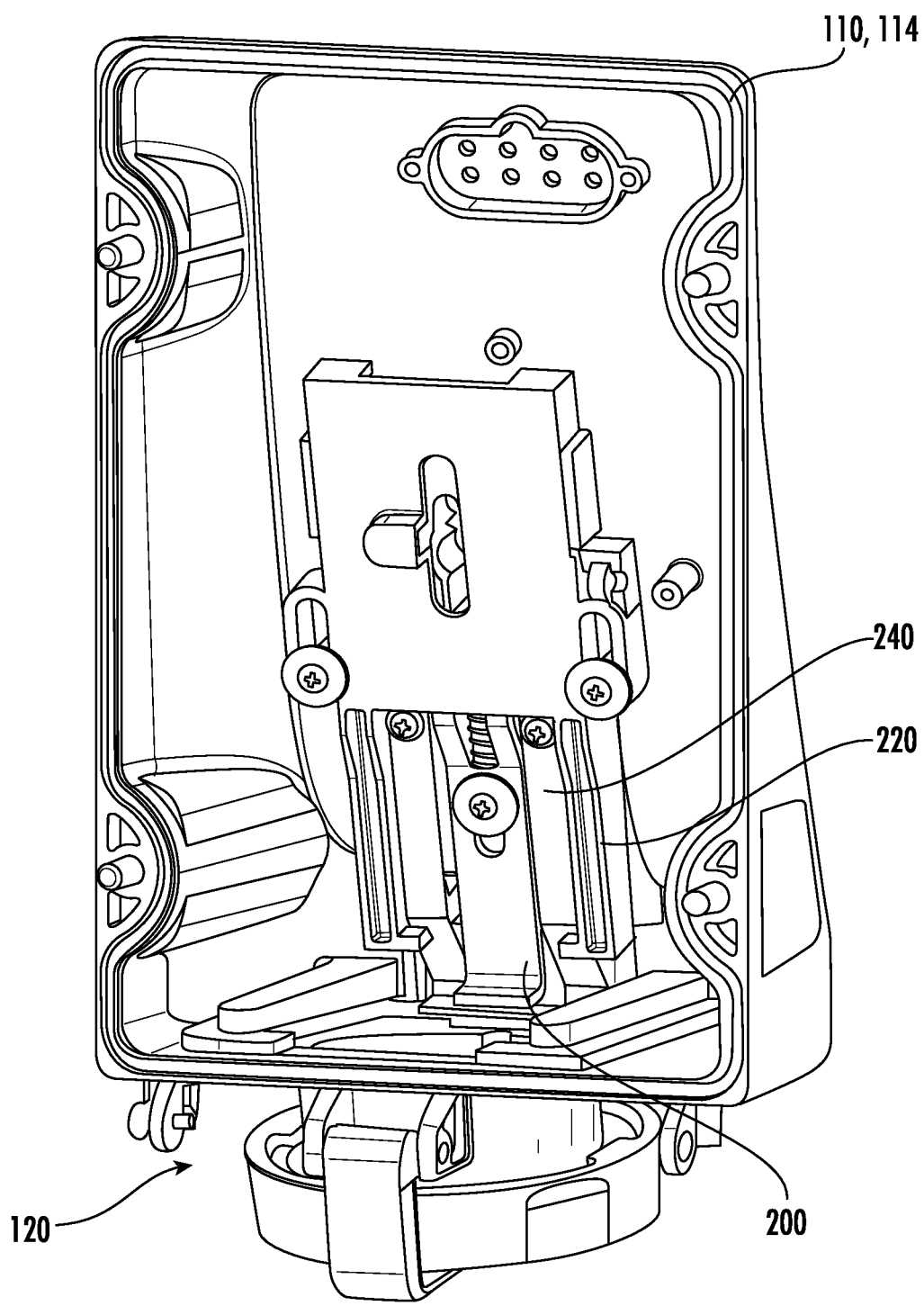
FIG. 9 is a partial, rear, perspective view of an example embodiment of an interlock latch, a slider plate, and a latch spring assembly for use with the mechanical interlock shown in FIG. 1, the slider plate and the latch spring illustrated in a first position.
Figure 10:
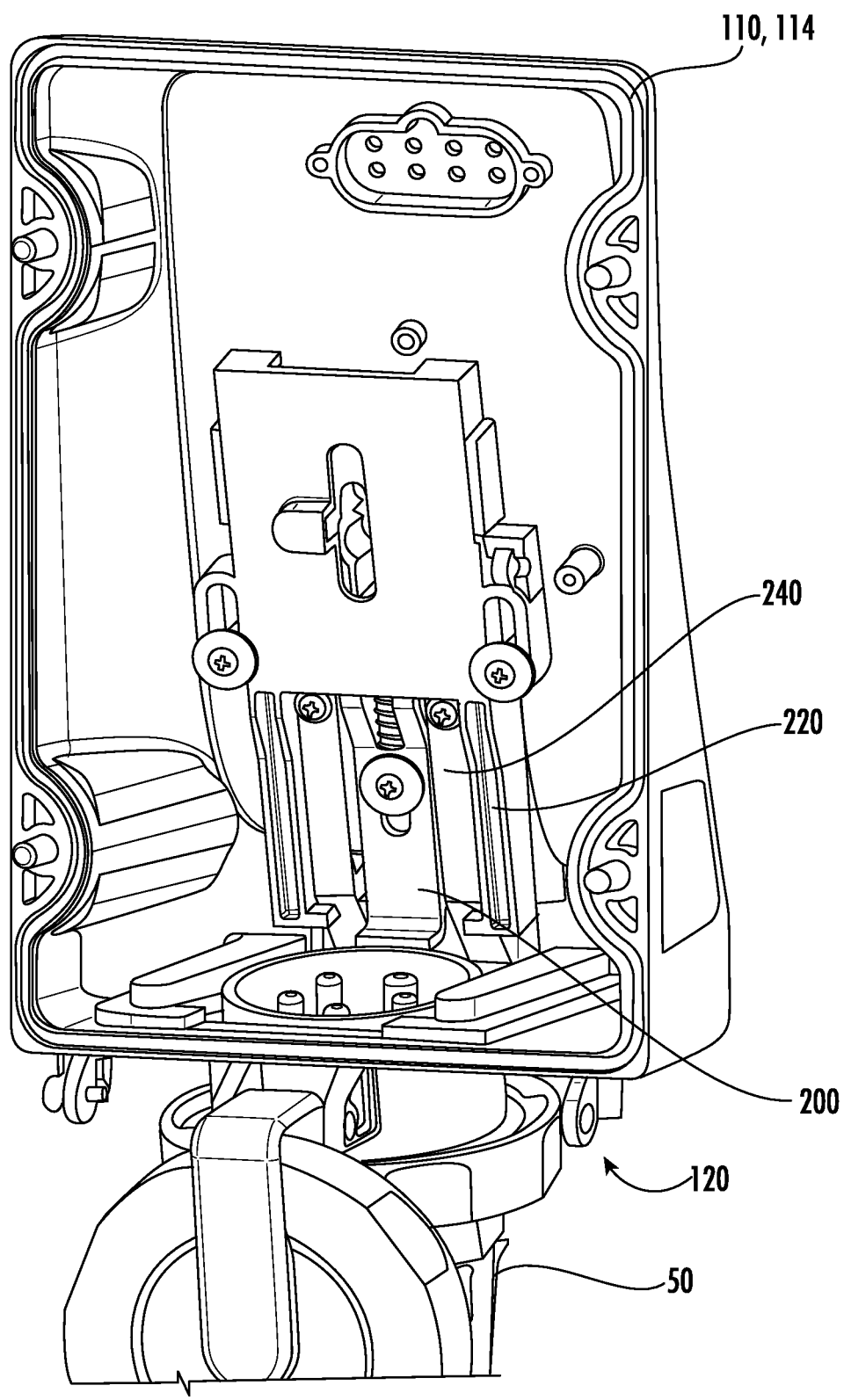
FIG. 10 is a partial, rear, perspective view of the slider plate and the latch spring shown in FIG. 9, the slider plate and the latch spring illustrated in a second position.

As previously mentioned, the mechanical interlock 100 may also include a slider plate 220 and a latch spring 240. In use, the slide plate 220 and the latch spring 240 act as a plug connector arranged and configured to prevent the plug 50 from being removed from the connector 120 when the handle assembly 140 is in the ON position. That is, in accordance with another aspect of the present disclosure, and as will be described in greater detail, in use, the slider plate 220 and the latch spring 240 are selectively movable between a first position (FIG. 9) and a second position (FIG. 10). In use, the latch spring 240 is arranged and configured to contact the plug 50 inserted into the connector 120 when the slider plate 220 and/or latch spring 240 is in the second position (FIG. 10) so that the plug 50 cannot be removed from the connector 120 when the external handle assembly 140 is in the ON position. In one embodiment, the slider plate 220 and the latch spring 240 are movable between the first position (FIG. 9) and the second position (FIG. 10) via rotation of the external handle assembly 140.

Figure 11:
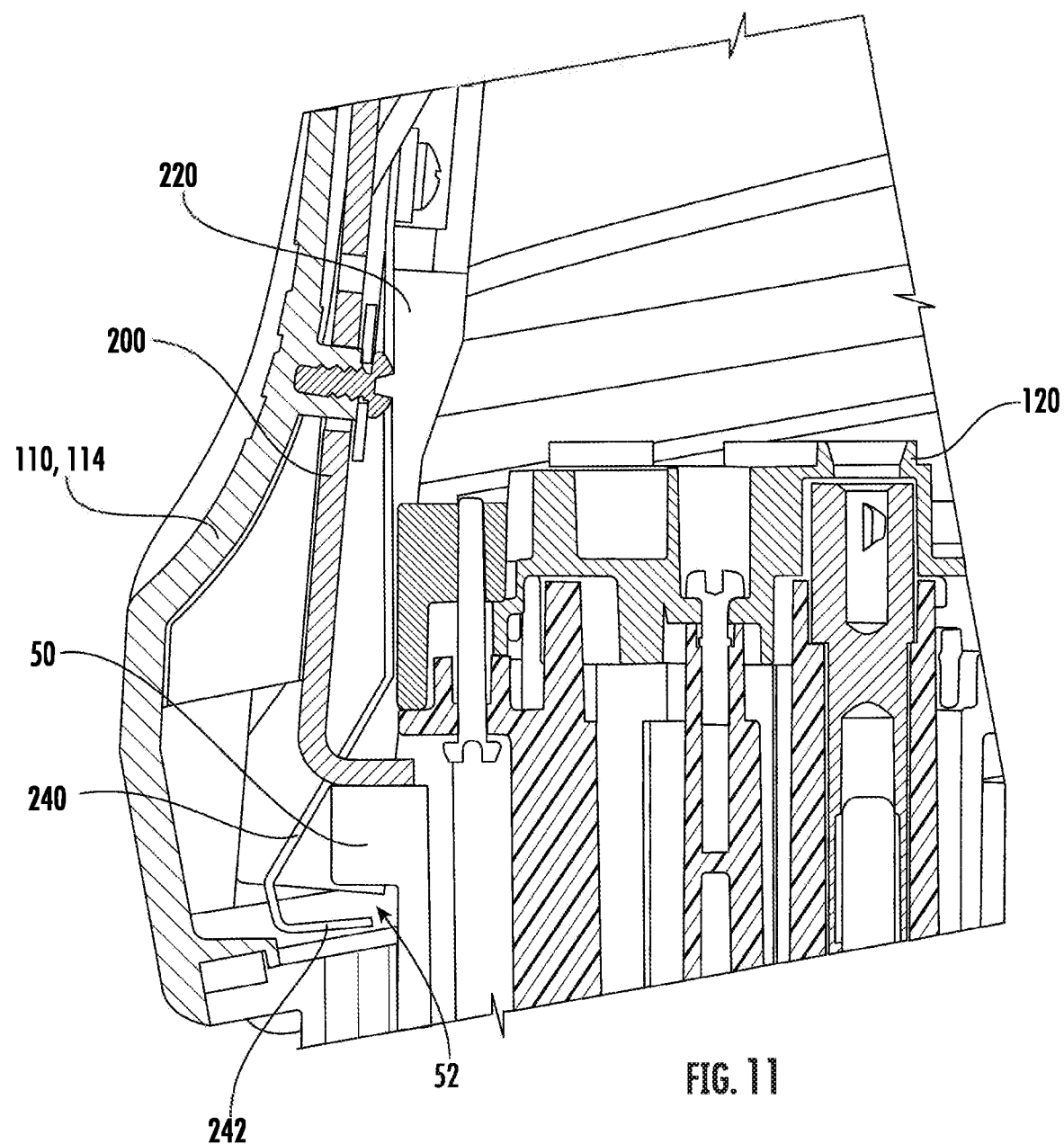
FIG. 11 is a detailed, cross-sectional view of the slider plate and the latch spring shown in FIG. 10, the slider plate and the latch spring illustrated in the second position.

In this manner, and as previously mentioned, in use, insertion of the plug 50 into the connector 120 of the mechanical interlock 100 causes the interlock latch 200 to move from its respective first position (FIGS. 2 and 4) to its respective second position (FIGS. 3 and 5) thus enabling rotation of the external handle assembly 140 from the OFF position to the ON position. In addition, rotation of the external handle assembly 140 from the OFF position to the ON position causes the slider plate 220 and the latch spring 240 to move. In one example embodiment, the slider plate 220 and the latch spring 240 move axially downwards (e.g., the slider plate 220 and the latch spring 240 move along a longitudinal axis of the slider plate 220 (e.g., the slider plate 220 and the latch spring 240 move in the opposite direction of the interlock latch 200)). Movement of the slider plate 220 and the latch spring 240 from their respective first positions (FIG. 9) to their respective second positions (FIG. 10) causes the latch spring 240 to operatively couple to the inserted plug 50. That is, referring to FIG. 11, when the latch spring 240 is in its second position (FIG. 10), the latch spring 240 engages or otherwise interacts with the inserted plug 50 in the connector 120 to prevent removal of the plug 50 when the external handle assembly 140 is in the ON position.

Figure 12:
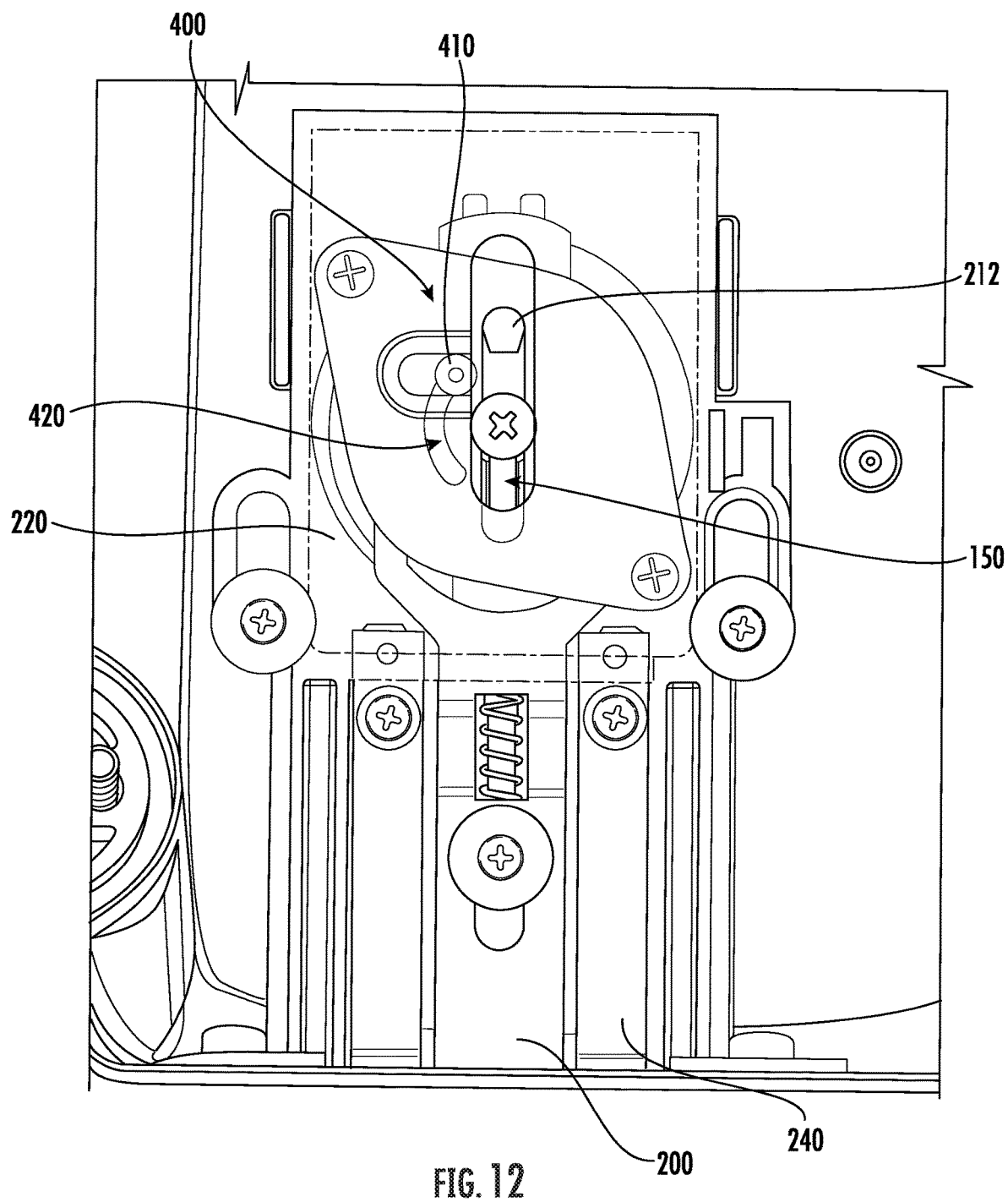
FIG. 12 is a partial, rear perspective view of an example embodiment of a cam mechanism for movably coupling the slider plate and the latch spring between first and second positions.

In use, the slider plate 220 and the latch spring 240 may be movably coupled relative to the enclosure 110 and/or the shaft 150 (e.g., handle shaft 152) by any suitable mechanism now known or hereafter developed. Referring to FIG. 12, in one embodiment, the slider plate 220 may be coupled to the shaft 150 via a cam mechanism 400 including a pin and bushing 410 coupled to the shaft 150 so that rotation of the external handle assembly 140 rotates the pin and bushing 410 along an arc with the pin and bushing 410 riding in a slot 420 formed within the slider plate 220. As the pin and bushing 410 moves through its arc, the slider plate 220 moves down (e.g., when the external handle assembly 140 is rotated from the OFF position to the ON position). As the slider plate 220 moves down, the latch spring 240 is deformed or flexes causing the latch spring 240 (e.g., base 242) to contact or otherwise interact with the inserted plug 50, thereby preventing the plug 50 from being withdrawn from the connector 120. That is, referring to FIG. 11, as the slider plate 220 moves down, the latch spring 240 deflects towards the front housing portion or cover 114 so that the plug 50 can be coupled to the connector 120. Thereafter, once the plug 50 has been properly inserted within the connector 120, the latch spring 240 flexes back (e.g., away from the front housing portion or cover 114) so that, for example, the base 242 of the latch spring 240 can be received within a space, groove, recess, or the like 52 of the plug 50 to prevent the plug 50 from being withdrawn from the connector 120. Thus, rotating the external handle assembly 140 from the OFF position to the ON position simultaneously activates the switch and locks the plug 50 to the connector 120.

Figure 13A:
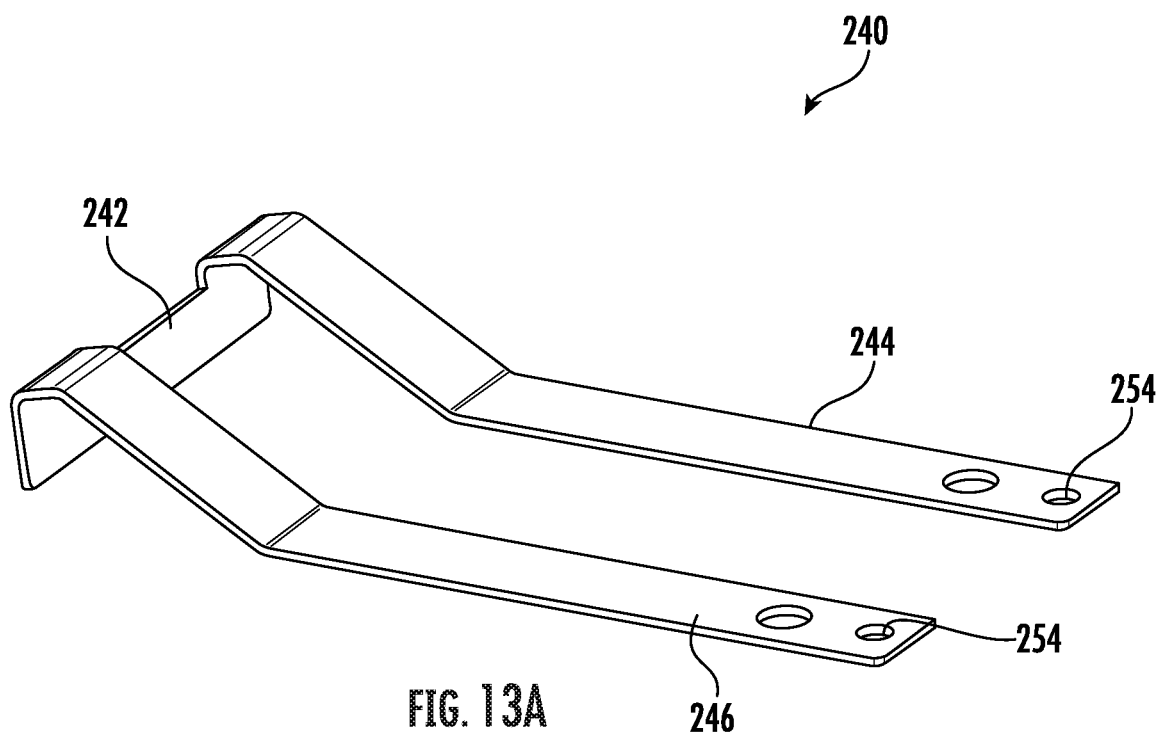
FIG. 13A is a rear perspective view of an example embodiment of a latch spring for use with the mechanical interlock shown in FIG. 1.
Figure 13B:
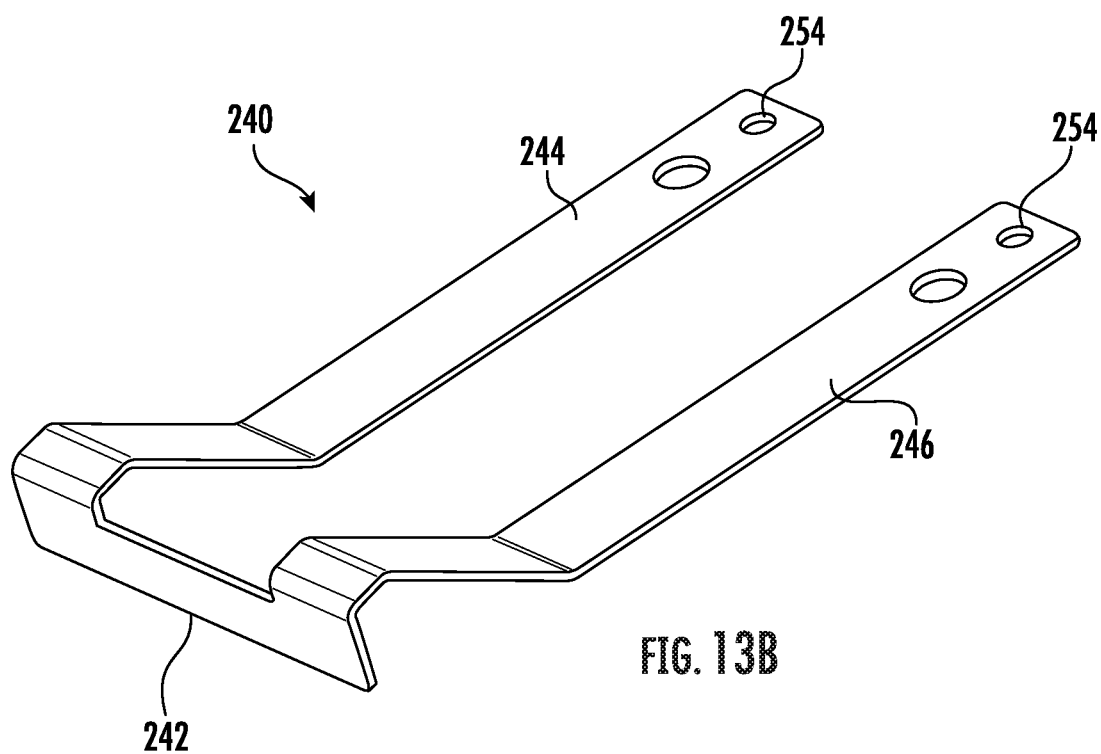
FIG. 13B is an alternate, rear perspective view of the latch spring shown in FIG. 12A.
Figure 13C:
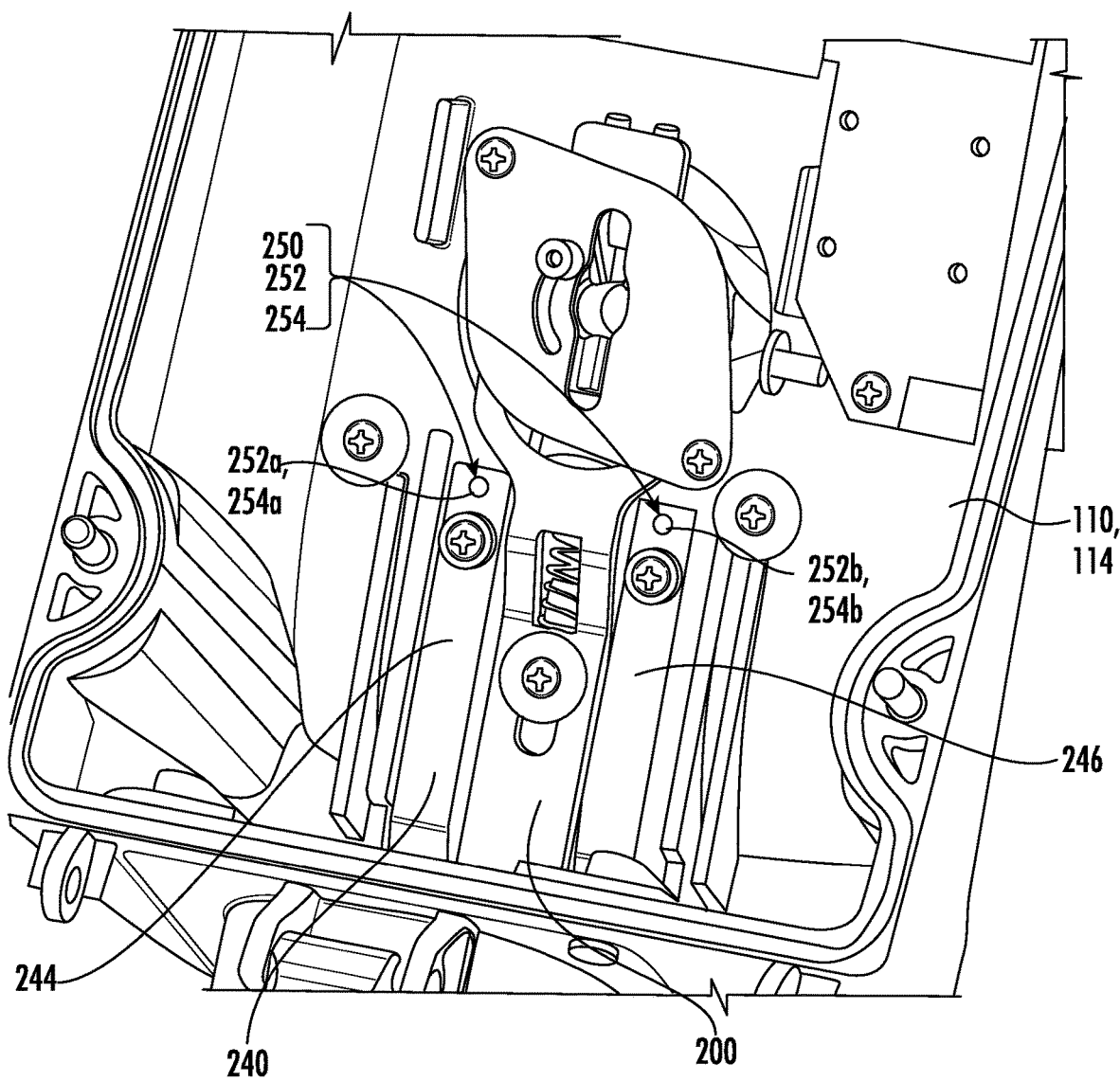
FIG. 13C is a partial, rear perspective view of the slider plate and the latch spring positioned in the enclosure.

Referring to FIGS. 13A, 13B, and 13C, in one example embodiment, the latch spring 240 may include a base 242 and first and second arms 244, 246 extending therefrom. In use, the first and second arms 244, 246 may be spaced from one another sufficiently to enable positioning of the interlock latch 200 therebetween. As illustrated, the first and second arms 244, 246 may lie in a plane offset from the base 242. In one non-limiting example embodiment, the base 242 is oriented perpendicular to the first and second arms 244, 246, and may also lie in a plane that is perpendicular to the plane of the first and second arms 244, 246. In order to ensure that the latch spring 240 is properly orientated when inserted into the mechanical interlock 200, the latch spring 240 and the enclosure 110 may include an alignment, key or keying feature (e.g., a Poke-Yoke mechanism) 250 incorporated therebetween (alignment, key and keying are used interchangeably herein without the intent to limit). That is, for example, to prevent incorrect or "flipped" installation of the latch spring 240 and to ensure proper operation (e.g., engagement and release), the latch spring 240 may incorporate a key 250 to ensure that the latch spring 240 can only be inserted in a proper orientation relative to the enclosure 110.

In use, the key 250 may be any suitable feature now known or hereafter developed to ensure proper installation of the latch spring 240 within the enclosure 110. For example, referring to FIG. 13C, the enclosure 110 may include one or more male features, bosses, projections, or the like 252 (used interchangeably herein without the intent to limit) and the latch spring 240 may include one or more female features, openings, holes, or the like 254 (used interchangeably herein without the intent to limit), arranged and configured to receive the boss 252 formed on the enclosure 110, or vice-versa. In this manner, the boss 252 extending from the enclosure 110 can only be received within the hole 254 formed in the latch spring 240 when the latch spring 240 is properly positioned within the enclosure 110, thus ensuring easy and failsafe assembly. That is, in this manner, the latch spring 240 can only be installed in a single orientation (e.g., cannot be accidentally or unintentionally rotated or flipped), thus, ensuring proper orientation and/or positioning of the latch spring 240 relative to the enclosure 110.

In one example embodiment, the enclosure 110 may include first and second bosses 252a, 252b protruding therefrom and the latch spring 240 (e.g., first and second arms 244, 246 of the latch spring 240) may include first and second holes 254a, 254b for receiving the first and second bosses 252a, 252b, respectively, extending from the enclosure 110. The bosses 252a, 252b and the holes 254a, 254b may be arranged and configured so that the first boss 252a is only receivable by the first hole 254a in the first arm 244 and the second boss 252b is only receivable in the second hole 254b in the second arm 246 when the latch spring 240 is properly positioned and/or orientated within the enclosure 110. By providing one feature or key different from the other, the latch spring 240 cannot be incorrectly inserted into the enclosure 110. In use, the key 250 may include different sized bosses 252 and holes 254. For example, the first boss 252a may be sized for receipt within the first hole 254a only and the second boss 252b may be sized for receipt within the second hole 254b only (e.g., the first and second holes 254a, 254b may be sized or shaped to be different from each other, while the first and second bosses 252a, 252b may likewise be shaped to be different from each other). Alternatively, the bosses 252 and the holes 254 may be arranged and configured so that if the latch spring 240 is inserted into the enclosure 110 in a rotated or flipped orientation, the first and second bosses 252a, 252b will not align with the first and second holes 254a, 254b. It should be appreciated that numerous variations of keys may be utilized to ensure that the latch spring 240 can only be inserted into the enclosure 110 in a single, proper orientation.

As should be appreciated, the key 250 may be any suitable mechanism or keying feature now known or hereafter developed so long as improper coupling and/or orientation of the latch spring 240 relative to the enclosure 110 is prevented. As such, the present disclosure should not be limited to the particular bosses and holes described and illustrated herein unless specifically claimed.

Figure 14:
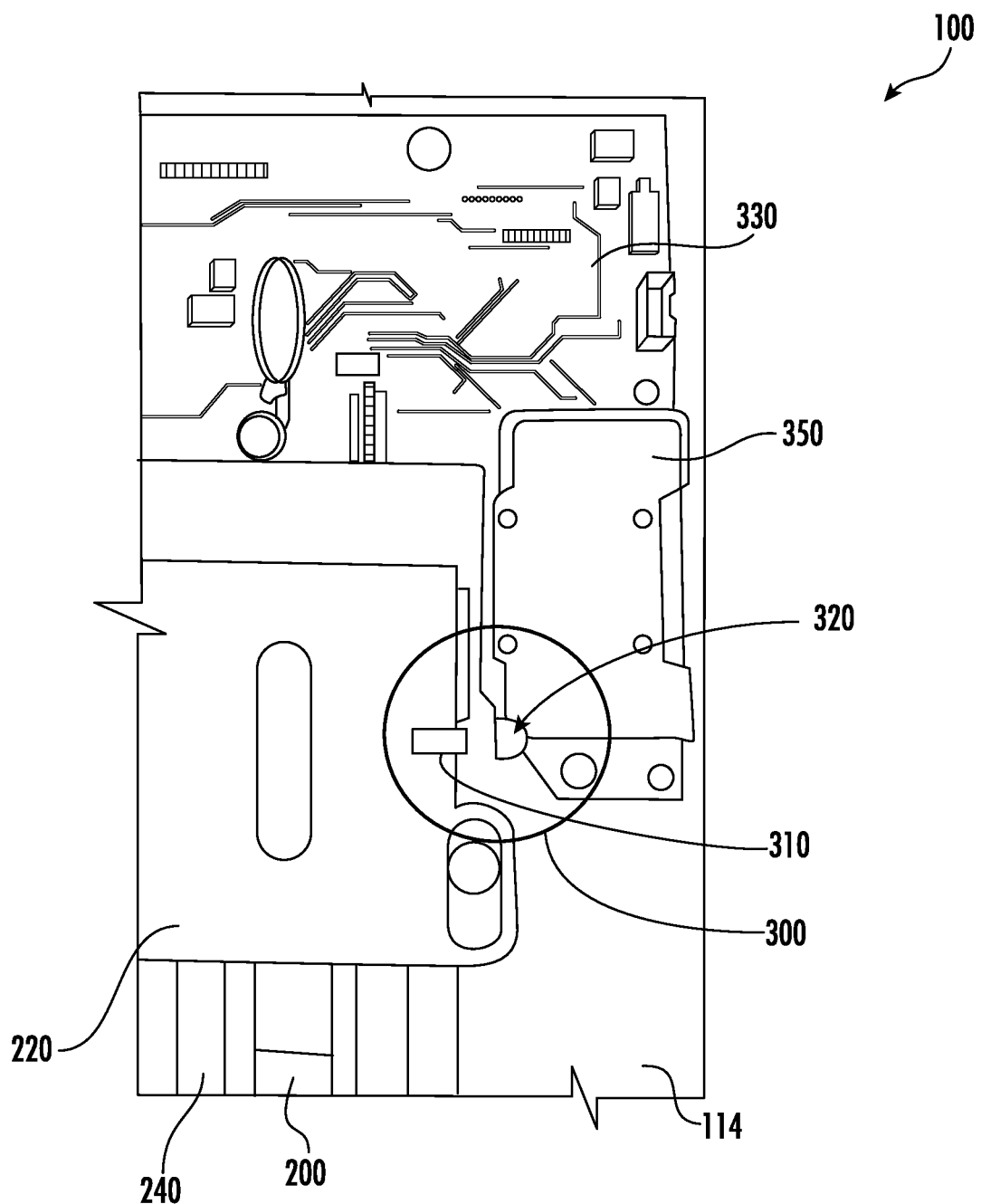
FIG. 14 is a partial, rear perspective view of an example embodiment of a magnetic switch for use with the mechanical interlock shown in FIG. 1.

Referring to FIG. 14, in accordance with another aspect of the present disclosure, the mechanical interlock 100 may include an integrated magnetic switch 300 to ensure that the position of the handle assembly 140 is known with certainty and so that the position of the handle assembly 140 relative to the electrical state of the load switch 130 (e.g., ON versus OFF) can be compared, monitored, etc., and, if necessary, one or more fault indications can be provided.

In one example embodiment, the mechanical interlock 100 may incorporate a magnet 310 such as, for example, a permanent magnet or the like, that may be affixed to a moving element that directly translates with the external handle assembly 140 so that, in use, the magnet 310 can be moved into and out of range relative to a sensor such as, for example, a hall-effect sensor 320. For example, in one embodiment, the magnet 310 may be coupled to the slider plate 220 so that movement of the slider plate 220 between the first and second positions moves the magnet 310 into and out of range relative to the sensor 320 located on, for example, a PCB board 330 coupled to an inside surface of the enclosure 100. Alternatively, the sensor 320 may be located on the slider plate 220 and the magnet 310 may be located on the PCB board 330. In use, the magnet 310 and sensor 320 may be coupled to the slider plate 220 and PCB 330 by any suitable mechanism now known or hereafter developed.

As will be appreciated by one of ordinary skill in the art, when the magnet 310 is located a certain distance away from the sensor 320, the magnet 310 will be out of a sensing range of the sensor 320, thus the magnetic flux from the magnet 310 will be out of range from the sensor 320 and the sensor 320 will not be triggered. Alternatively, when the magnet 310 moves towards the sensor 320, the magnetic flux from the magnet 310 will be within a certain distance or range of the sensor 320 to trigger the sensor 320.

As illustrated, with the slider plate 220 in the first position (e.g., corresponding to the OFF position of the handle assembly 140), the magnet 310 positioned on the slider plate 220 will be within range of the sensor 320 so that the magnet 310 interacts with the sensor 320 to provide a signal that the external handle assembly 140 is in the OFF position. Meanwhile, with the slider plate 220 in the second position (e.g., corresponding to the ON position of the handle assembly 140), the magnet 310 positioned on the slider plate 220 is moved axially so that the magnet 310 is no longer within range of the sensor 320 so that the magnet 310 no longer interacts with the sensor 320 thus providing no signal. Alternatively, it is envisioned that the magnet 310 may be arranged and configured to interact with the sensor 320 when in the ON position but not in the OFF position.

In use, the signal generated by the magnetic flux created when the magnet 310 is positioned within range of the sensor 320 is transmitted to a processor (not shown) located on, for example, the printed circuit board or PCB 330. The processor may also be communicatively coupled to the load switch 130 so that the processor receives a signal corresponding to the state of the load switch 130 (e.g., ON or OFF). In this manner, the magnetic switch 300 in combination with the processor compares the actual position of the external handle assembly 140 relative to the state of the load switch 130 (e.g., ON or OFF), and, if desired, provides one or more fault indications. That is, in one example embodiment, the magnetic switch 300 can be used to verify the position of the external handle assembly 140, and this information can be provided to, for example, a processor. In addition, using one or more sensors, the processor can receive data concerning the state of the load switch 130 such as, for example, whether power is being supplied. Thereafter, the processor can compare the position of the handle assembly 140 to the electrical state of the load switch 130 to determine if one or more fault conditions exists, and if so, to provide an indication of fault.

For example, due to one or more fault conditions, the mechanical interlock 100 could be supplying power even though the external handle assembly 140 is in the OFF position, or vice versa. During such an event, it would be advantageous to provide one or more fault indicators. For example, due to an overload condition, the electrical contacts in the mechanical interlock 100 could be heated to the point that they are welded closed so that the mechanical interlock 100 is constantly supplying power even though the external handle assembly 140 may be in the OFF position. In such an event, the processor can detect that the mechanical interlock 100 is supplying power (e.g., the load switch 130 is in the ON position) while detecting that the external handle assembly 140 is in the OFF position, and as a result could provide one or more fault indicators.

In use, the one or more fault indicators could be any suitable indication now known or hereafter developed. For example, the indication could be one or more LEDs on the enclosure 110, could be one or more wireless signals, texts, emails, or the like transmitted by the mechanical interlock 100, etc.

Referring to FIG. 14, the mechanical interlock 100 may also incorporate one or more battery backups 350 to, for example, supply power to the processor, PCB, fault indicator, etc. so that if a loss of neutral or ground occurs, the mechanical interlock 100 can still provide one or more fault indicators as desired. That is, the mechanical interlock 100 may include a battery power supply for supplying backup power to the magnetic switch 300 and the processor in case where mains power is lost.

While the present disclosure refers to certain embodiments, numerous modifications, alterations, and changes to the described embodiments are possible without departing from the sphere and scope of the present disclosure, as defined in the appended claim(s). Accordingly, it is intended that the present disclosure not be limited to the described embodiments, but that it has the full scope defined by the language of the following claims, and equivalents thereof. The discussion of any embodiment is meant only to be explanatory and is not intended to suggest that the scope of the disclosure, including the claims, is limited to these embodiments. In other words, while illustrative embodiments of the disclosure have been described in detail herein, it is to be understood that the inventive concepts may be otherwise variously embodied and employed, and that the appended claims are intended to be construed to include such variations, except as limited by the prior art.

The foregoing discussion has been presented for purposes of illustration and description and is not intended to limit the disclosure to the form or forms disclosed herein. For example, various features of the disclosure are grouped together in one or more aspects, embodiments, or configurations for the purpose of streamlining the disclosure. However, it should be understood that various features of the certain aspects, embodiments, or configurations of the disclosure may be combined in alternate aspects, embodiments, or configurations. Moreover, the following claims are hereby incorporated into this Detailed Description by this reference, with each claim standing on its own as a separate embodiment of the present disclosure.

As used herein, an element or step recited in the singular and proceeded with the word "a" or "an" should be understood as not excluding plural elements or steps, unless such exclusion is explicitly recited. Furthermore, references to "one embodiment" of the present disclosure are not intended to be interpreted as excluding the existence of additional embodiments that also incorporate the recited features.

The phrases "at least one", "one or more", and "and/or", as used herein, are open-ended expressions that are both conjunctive and disjunctive in operation. The terms "a" (or "an"), "one or more" and "at least one" can be used interchangeably herein. All directional references (e.g., proximal, distal, upper, lower, upward, downward, left, right, lateral, longitudinal, front, back, top, bottom, above, below, vertical, horizontal, radial, axial, clockwise, and counterclockwise) are only used for identification purposes to aid the reader's understanding of the present disclosure, and do not create limitations, particularly as to the position, orientation, or use of this disclosure. Connection references (e.g., engaged, attached, coupled, connected, and joined) are to be construed broadly and may include intermediate members between a collection of elements and relative to movement between elements unless otherwise indicated. As such, connection references do not necessarily infer that two elements are directly connected and in fixed relation to each other. All rotational references describe relative movement between the various elements. Identification references (e.g., primary, secondary, first, second, third, fourth, etc.) are not intended to connote importance or priority but are used to distinguish one feature from another. The drawings are for purposes of illustration only and the dimensions, positions, order and relative to sizes reflected in the drawings attached hereto may vary.

What is claimed is:

1. A mechanical interlock comprising:
an enclosure;
a connector at least partially received within the enclosure for selectively receiving a plug;
a load switch positioned within the enclosure, the load switch arranged and configured to selectively supply power to the connector;
a handle assembly operatively associated with the enclosure, the handle assembly being selectively movable between an ON position and an OFF position to selectively energize and deenergize the load switch;
a shaft for rotationally coupling the handle assembly to the load switch;
an interlock latch arranged and configured to be operatively associated with the connector and the handle assembly, the interlock latch axially translatable between a first position and a second position, wherein, when in the first position, the interlock latch engages the handle assembly to prevent rotation of the handle assembly, and when in the second position, the interlock latch is axially translated relative to the handle assembly to decouple the interlock latch from the handle assembly to enable rotation of the handle assembly so that the handle assembly can be moved from the OFF position to the ON position; and
a slider plate and a latch spring, wherein rotation of the handle assembly from the OFF position to the ON position causes the slider plate to translate longitudinally towards the connector so that a portion of the latch spring engages a ledge on the plug so that the latch spring engages the plug to prevent removal of the plug from the connector, a direction of movement of the latch spring being substantially perpendicular to the translation of the slider plate.

2. The mechanical interlock of claim 1, wherein the interlock latch includes a first end and a second end, the first end being arranged and configured to contact the plug upon insertion of the plug into the connector, wherein upon plug insertion, the interlock latch is axially translated by the plug, without rotation of the plug, from the first position to the second position.

3. The mechanical interlock of claim 2, wherein the shaft includes a handle portion operatively coupled to the handle assembly and a switch portion operatively coupled to the load switch, the handle portion being operatively coupled to the switch portion, the second end of the interlock latch being selectively coupled to the handle portion so that, when the interlock latch is in the first position, the second end of the interlock latch engages the handle portion so that rotation of the handle portion and the handle assembly is prevented, and, when the interlock latch is in the second position, the second end of the interlock latch is decoupled from the handle portion so that rotation of the handle portion and the handle assembly is permitted.

4. The mechanical interlock of claim 3, wherein the interlock latch includes an opening that the handle portion passes through.

5. The mechanical interlock of claim 3, wherein the second end of the interlock latch includes a key and the handle portion includes a slot, the key being received within the slot formed in the handle portion when the interlock latch is in the first position.

6. The mechanical interlock of claim 5, wherein the key includes at least one of sloped sides and rounded corners for interacting with the slot formed in the handle portion.

7. The mechanical interlock of claim 1, wherein the latch spring is coupled to the enclosure, the latch spring and the enclosure each including a key arranged and configured to secure a desired orientation of the latch spring relative to the enclosure.

8. The mechanical interlock of claim 7, wherein the key formed on the enclosure includes one or more bosses and the key formed on the latch spring includes one or more holes, the one or more holes being arranged and configured to receive the one or more bosses, respectively, when the latch spring is properly positioned within the enclosure.

9. The mechanical interlock of claim 1, further comprising a magnetic switch including a magnet and a sensor arranged and configured to determine a position of the handle assembly.

10. The mechanical interlock of claim 9, wherein, when the handle assembly is in the OFF position, the magnet is arranged and configured to interact with the sensor to provide an indication that the handle assembly is in the OFF position, and when the handle assembly is in the ON position, the magnet is positioned at a distance from the sensor such that the sensor does not sense the magnet.

11. The mechanical interlock of claim 10, further comprising a processor programmed to compare the position of the handle assembly as determined by the magnetic switch against an electrical state of the load switch to provide one or more fault indications depending upon the comparison.

12. The mechanical interlock of claim 11, further comprising a battery power supply for supplying backup power to the magnetic switch and the processor in case of mains power lost.

13. The mechanical interlock of claim 9, wherein movement of the handle assembly between the ON and OFF positions causes the sensor to selectively detect a presence of the magnet to determine the position of the handle assembly.

14. A mechanical interlock comprising:
an enclosure;
a connector at least partially received within the enclosure for selectively receiving a plug;
a load switch positioned within the enclosure, the load switch arranged and configured to selectively supply power to the connector;
a handle assembly operatively associated with the enclosure, the handle assembly being selectively movable between an ON position and an OFF position to selectively energize and deenergize the load switch;
a shaft for rotationally coupling the handle assembly to the load switch;
an interlock latch arranged and configured to be operatively associated with the connector and the handle assembly, the interlock latch movable between a first position and a second position, wherein, when in the first position, the interlock latch prevents rotation of the handle assembly, and when in the second position, the interlock latch axially translates relative to the handle assembly to decouple the interlock latch to enable rotation of the handle assembly so that the handle assembly can be moved from the OFF position to the ON position; and
a plug connector arranged and configured to prevent the plug from being removed from the connector when the handle assembly is in the ON position;
wherein the plug connector includes a slider plate and a latch spring, in use, rotation of the handle assembly from the OFF position to the ON position causes the slider plate to translate longitudinally towards the connector so that a portion of the latch spring engages a ledge on the plug so that the latch spring engages the plug to prevent removal of the plug from the connector, a direction of movement of the latch spring being substantially perpendicular to the translation of the slider plate;
wherein the interlock latch includes a first end and a second end, the first end being arranged and configured to contact the plug, wherein upon insertion of the plug into the connector, the interlock latch axially translates via contact with the plug, without rotation of the plug, from the first position to the second position.

15. The mechanical interlock of claim 14, wherein:
the enclosure includes a back surface, a front surface, a top surface, a bottom surface, side surfaces, and a longitudinal axis extending between the top and bottom surfaces;
the interlock latch includes a longitudinal axis generally parallel to the longitudinal axis of the enclosure; and
the interlock latch is axially translated generally parallel to the longitudinal axis of the interlock latch and the enclosure.

16. The mechanical interlock of claim 1, wherein the interlock latch is monolithically formed.

17. The mechanical interlock of claim 1, wherein:
the enclosure includes a back surface, a front surface, a top surface, a bottom surface, side surfaces, and a longitudinal axis extending between the top and bottom surfaces; and
the interlock latch includes a longitudinal axis extending generally parallel to the longitudinal axis of the enclosure; and
the interlock latch is axially translated generally parallel to the longitudinal axis of the interlock latch and the enclosure.

* * * * *